(12) United States Patent
Su

(10) Patent No.: US 11,481,067 B2
(45) Date of Patent: Oct. 25, 2022

(54) SHIFT REGISTER UNIT

(71) Applicants: BEIJING BOE DISPLAY TECHNOLOGY CO., LTD., Beijing (CN); BOE TECHNOLOGY GROUP CO., LTD., Beijing (CN)

(72) Inventor: Qiujie Su, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/454,944

(22) Filed: Nov. 15, 2021

(65) Prior Publication Data

US 2022/0075498 A1    Mar. 10, 2022

Related U.S. Application Data

(63) Continuation of application No. 16/612,998, filed as application No. PCT/CN2019/076432 on Feb. 28, 2019, now Pat. No. 11,221,710.

(30) Foreign Application Priority Data

Jul. 11, 2018 (CN) .......................... 201810757914.0

(51) Int. Cl.
   *G06F 3/041*  (2006.01)
   *G09G 3/20*   (2006.01)
   *G11C 19/28*  (2006.01)

(52) U.S. Cl.
   CPC .......... *G06F 3/04166* (2019.05); *G09G 3/20* (2013.01); *G11C 19/28* (2013.01);
   (Continued)

(58) Field of Classification Search
   CPC .................. G06F 3/04166; G09G 3/20; G09G 2300/0426; G09G 2300/0842; G09G 2310/0286; G09G 2310/08; G11C 19/28
   See application file for complete search history.

(56) References Cited

U.S. PATENT DOCUMENTS

2010/0007635 A1    1/2010   Kwon et al.
2015/0269899 A1    9/2015   Ma
(Continued)

FOREIGN PATENT DOCUMENTS

CN    101093647 A    12/2007
CN    101625838 A    1/2010
(Continued)

OTHER PUBLICATIONS

First Office Action for Chinese Application No. 201810757914.0, dated Aug. 29, 2019, 5 Pages.
(Continued)

*Primary Examiner* — Sejoon Ahn
(74) *Attorney, Agent, or Firm* — Brooks Kushman P.C.

(57) ABSTRACT

A shift register unit includes a first pull-up node control circuit, a second pull-up node control circuit, a pull-down node control circuit, an output pull-up circuit and an output pull-down circuit. The first pull-up node control circuit is configured to control a first pull-up node to be electrically connected to a second voltage end under the control of an input signal, and control the first pull-up node to be electrically connected to a first voltage end under the control of a resetting signal. The second pull-up node control circuit is configured to control the second pull-up node to be electrically connected to the second voltage end under the control of the input signal applied to the input end, and control the
(Continued)

second pull-up node to be electrically connected to the first voltage end under the control of the resetting signal from the resetting end.

17 Claims, 5 Drawing Sheets

(52) U.S. Cl.
CPC .............. *G09G 2300/0426* (2013.01); *G09G 2300/0842* (2013.01); *G09G 2310/0286* (2013.01); *G09G 2310/08* (2013.01)

(56) References Cited

U.S. PATENT DOCUMENTS

| | | | |
|---|---|---|---|
| 2016/0049126 A1 | 2/2016 | Zhang et al. | |
| 2016/0266699 A1 | 9/2016 | Zhao et al. | |
| 2018/0108290 A1 | 4/2018 | Chen | |
| 2020/0341340 A1* | 10/2020 | Takahashi | G02F 1/136286 |
| 2020/0342799 A1* | 10/2020 | Yang | H01L 27/14812 |

FOREIGN PATENT DOCUMENTS

| | | |
|---|---|---|
| CN | 104021769 A | 9/2014 |
| CN | 104732946 A | 6/2015 |
| CN | 105513524 A | 4/2016 |
| CN | 107452350 A | 12/2017 |
| CN | 108648714 A | 10/2018 |

OTHER PUBLICATIONS

International Search Report and Written Opinion for Application No. PCT/CN2019/076432, dated May 28, 2019, 11 Pages.

\* cited by examiner

SHIFT REGISTER UNIT

CROSS-REFERENCE TO RELATED APPLICATIONS

This application is a continuation application of co-pending U.S. patent application Ser. No. 16/612,998 filed Nov. 12, 2019, which is the U.S. national phase of PCT Application No. PCT/CN2019/076432 filed Feb. 28, 2019, which claims priority to Chinese Patent Application No. 201810757914.0 filed Jul. 11, 2018, which are incorporated herein by reference in their entireties.

TECHNICAL FIELD

The present disclosure relates to the field of display driving technology, in particular to a shift register unit.

BACKGROUND

During the operation of an in-cell touch display device, each touch time period needs to persist for a long time (at a millisecond level), so such a phenomenon as current leakage may occur, within each touch time period, for a potential at a pull-up node PU of a Gate On Array (GOA) unit in a first row after the touch time period, and a voltage across the pull-up node PU may decrease. At this time, a voltage outputted by a gate driving signal output end of the GOA unit may decrease too, and even it is impossible to enable a corresponding gate line, thereby the charging of a pixel may be adversely affected.

SUMMARY

A main object of the present disclosure is to provide a shift register unit, so as to solve the above-mentioned problem.

In one aspect, the present disclosure provides in some embodiments a shift register unit, including a first pull-up node control circuit, a second pull-up node control circuit, a pull-down node control circuit, an output pull-up circuit and an output pull-down circuit, wherein the first pull-up control circuit is electrically connected to a first pull-up node, a first voltage end, an input end, a resetting end and a second voltage end, and configured to control the first pull-up node to be electrically connected to the second voltage end under the control of an input signal applied to the input end, and control the first pull-up node to be electrically connected to the first voltage end under the control of a resetting signal from the resetting end; the second pull-up node control circuit is electrically connected to a second pull-up node, the first voltage end, the input end, the resetting end and the second voltage end, and configured to control the second pull-up node to be electrically connected to the second voltage end under the control of the input signal applied to the input end, and control the second pull-up node to be electrically connected to the first voltage end under the control of the resetting signal from the resetting end; the pull-down node control circuit is electrically connected to the pull-down node, the second pull-up node and a third voltage end, and configured to control a potential at the pull-down node under the control of a voltage signal at the second pull-up node; the output pull-up circuit is electrically connected to the first pull-up node, a clock signal end, and a gate driving signal output end, and configured to control the gate driving signal output end to be electrically connected to the clock signal end under the control of a voltage signal at the first pull-up node; and the output pull-down circuit is electrically connected to the pull-down node and the gate driving signal output end, and configured to control a potential of the gate driving signal output end under the control of the voltage signal at the pull-down node.

In a possible embodiment of the present disclosure, the first pull-up node control circuit includes: a first transistor, a gate electrode of which is connected to the input end, a first electrode of which is connected to the second voltage end, and a second electrode of which is connected to the first pull-up node; a second transistor, a gate electrode of which is connected to the resetting end, a first electrode of which is connected to the first pull-up node, and a second electrode of which is connected to the first voltage end.

In a possible embodiment of the present disclosure, the second pull-up node control circuit includes: an eleventh transistor, a gate electrode of which is connected to the input end, a first electrode of which is connected to the second voltage end, and a second electrode of which is connected to the second pull-up node; and a twelfth transistor, a gate electrode of which is connected to the resetting end, a first electrode of which is connected to the second pull-up node, and a second electrode of which is connected to the first voltage end.

In a possible embodiment of the present disclosure, the pull-down control circuit includes: a ninth transistor, a gate electrode of which is connected to a first electrode of the ninth transistor, and a second electrode of which is connected to a pull-down control node; an eighth transistor, a first electrode of which is connected to the pull-down control node; a fifth transistor, a gate electrode of which is connected to the pull-down control node, and a second electrode of which is connected to the pull-down node; and a sixth transistor, a gate electrode of which is connected to the second pull-up node, a first electrode of which is connected to the pull-down node, and a second electrode of which is connected to the third voltage end.

In a possible embodiment of the present disclosure, the output pull-up circuit includes: a third transistor, a gate electrode of which is connected to the first pull-up node, a first electrode of which is connected to the clock signal end, and a second electrode of which is connected to the gate driving signal output end; and a storage capacitor, a first end of which is connected to the first pull-up node, and a second end of which is connected to the gate driving signal output end.

In a possible embodiment of the present disclosure, the output pull-down circuit includes a tenth transistor, a gate electrode of which is connected to the pull-down node, a first electrode of which is connected to the gate driving signal output end.

In a possible embodiment of the present disclosure, the shift register unit further includes an output resetting circuit connected to the gate driving signal output end, and configured to reset the gate driving signal output end.

In a possible embodiment of the present disclosure, the output resetting circuit includes a fourth transistor, a first electrode of which is connected to the gate driving signal output end, and a second electrode of which is connected to a reset voltage end.

In a possible embodiment of the present disclosure, the first pull-up node control circuit is further connected to the pull-down node, and configured to control a potential of the first pull-up node under control of the pull-down node.

In a possible embodiment of the present disclosure, the first pull-up node control circuit further includes a seventh transistor, a gate electrode of which is connected to the pull-down node, a first electrode of which is connected to the first pull-up node.

In a second aspect, an embodiment of the present disclosure provides a shift register unit, including a first pull-up node control circuit, a second pull-up node control circuit, a pull-down node control circuit, an output pull-up circuit and an output pull-down circuit, wherein the first pull-up control circuit is electrically connected to a first pull-up node, a first voltage end, an input end, a resetting end, and a second voltage end, wherein the first pull-up node control circuit comprises a first transistor, a gate electrode of which is connected to the input end, a first electrode of which is connected to the second voltage end, and a second electrode of which is connected to the first pull-up node; a second transistor, a gate electrode of which is connected to the resetting end, a first electrode of which is connected to the first pull-up node, and a second electrode of which is connected to the first voltage end; the second pull-up node control circuit is electrically connected to a second pull-up node, the first voltage end, the input end, the resetting end and the second voltage end, wherein the second pull-up node control circuit comprises an eleventh transistor, a gate electrode of which is connected to the input end, a first electrode of which is connected to the second voltage end, and a second electrode of which is connected to the second pull-up node; and a twelfth transistor, a gate electrode of which is connected to the resetting end, a first electrode of which is connected to the second pull-up node, and a second electrode of which is connected to the first voltage end; the pull-down node control circuit is electrically connected to the pull-down node, the second pull-up node and a third voltage end; the output pull-up circuit is electrically connected to the first pull-up node, a clock signal end, and a gate driving signal output end; and the output pull-down circuit is directly connected to the pull-down node and the gate driving signal output end.

In a possible embodiment of the present disclosure, the first pull-up node control circuit is further connected to the pull-down node, the first pull-up node control circuit further includes: a seventh transistor, a gate electrode of which is directly connected to the pull-down node, a first electrode of which is directly connected to the first pull-up node.

In a possible embodiment of the present disclosure, the pull-down node control circuit includes: a ninth transistor, a gate electrode of which is connected to a first electrode of the ninth transistor, and a second electrode of which is directly connected to the pull-down control node; an eighth transistor, a first electrode of which is directly connected to the pull-down control node; a fifth transistor, a gate electrode of which is directly connected to the pull-down control node, and a second electrode of which is directly connected to the pull-down node; and a sixth transistor, a gate electrode of which is directly connected to the second pull-up node, a first electrode of which is directly connected to the pull-down node, and a second electrode of which is directly connected to the third voltage end.

In a possible embodiment of the present disclosure, the output pull-up circuit includes: a third transistor, a gate electrode of which is directly connected to the first pull-up node, a first electrode of which is directly connected to the clock signal end, and a second electrode of which is directly connected to the gate driving signal output end; and a storage capacitor, a first end of which is directly connected to the first pull-up node, and a second end of which is directly connected to the gate driving signal output end.

In a possible embodiment of the present disclosure, the output pull-down circuit includes a tenth transistor, a gate electrode of which is directly connected to the pull-down node, a first electrode of which is directly connected to the gate driving signal output end.

In a possible embodiment of the present disclosure, the shift register unit further includes an output resetting circuit electrically connected to the gate driving signal output end, the output resetting circuit comprises a fourth transistor, a first electrode of which is connected to the gate driving signal output end, and a second electrode of which is connected to a reset voltage end.

In a third aspect, an embodiment of the present disclosure provides a shift register unit including: a first transistor comprising a gate electrode electrically connected to an input end, a first electrode electrically connected to a second voltage end, a second electrode electrically connected to a first control node; a second transistor comprising a gate electrode electrically connected to a resetting end, a first electrode electrically connected to the first control node, a second electrode electrically connected to a first voltage end; an eleventh transistor comprising a gate electrode electrically connected to the input end, a first electrode electrically connected to the second voltage end, a second electrode electrically connected to a second control node; a twelfth transistor comprising a gate electrode electrically connected to the resetting end, a first electrode electrically connected to the second control node, a second electrode electrically connected to the first voltage end; a seventh transistor comprising a gate electrode electrically connected to a third control node, a first electrode electrically connected to the first control node; a ninth transistor comprising a gate electrode electrically connected to a first electrode of the ninth transistor, a second electrode electrically connected to a fourth control node; an eighth transistor comprising a first electrode electrically connected the fourth control node; a fifth transistor comprising a gate electrode electrically connected to the fourth control node, a second electrode electrically connected to the third control node; a sixth transistor comprising a gate electrode electrically connected to the second control node, a first electrode electrically connected the third control node, a second electrode electrically connected to the third voltage end; a third transistor comprising a gate electrode electrically connected to the first control node, a first electrode electrically connected to a clock signal end, a second electrode electrically connected to a gate driving signal output end; a storage capacitor comprising a first end electrically connected to the first control node, a second end electrically connected to the gate driving signal output end; a tenth transistor comprising a gate electrode electrically connected to the third control node, a first electrode electrically connected to the gate driving signal output end.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

All transistors adopted in the embodiments of the present disclosure may be thin film transistors (TFTs), field effect transistors (FETs) or any other elements having an identical characteristic. In order to differentiate two electrodes other than a gate electrode from each other, one of the two electrodes is called as first electrode and the other is called as second electrode. In actual use, the first electrode may be a drain electrode while the second electrode may be a source electrode, or the first electrode may be a source electrode while the second electrode may be a drain electrode.

Figure 1:
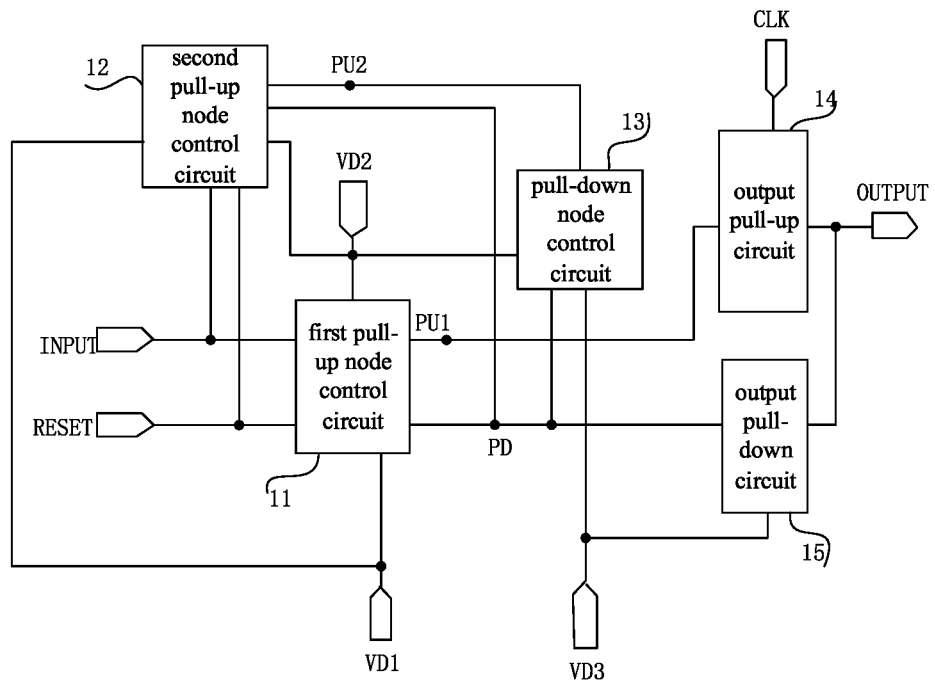
FIG. 1 is a schematic view showing a shift register unit according to one embodiment of the present disclosure.

The present disclosure provides in some embodiments a shift register unit which, as shown in FIG. 1, includes a first pull-up node control circuit 11, a second pull-up node control circuit 12, a pull-down node control circuit 13, an output pull-up circuit 14 and an output pull-down circuit 15. The first pull-up control circuit 11 is connected to a first pull-up node PU1, a first voltage end VD1, an input end INPUT, a resetting end RESET, a pull-down node PD and a second voltage end VD2, and configured to control the first pull-up node PU1 to be electrically connected to the second voltage end VD2 under the control of an input signal applied to the input end INPUT, and control the first pull-up node PU1 to be electrically connected to the first voltage end VD1 under the control of a resetting signal from the resetting end RESET and/or a voltage signal at the pull-down node PD. The second pull-up node control circuit 12 is connected to a second pull-up node PU2, the first voltage end VD1, the input end INPUT, the resetting end RESET, the pull-down node PD and the second voltage end VD2, and configured to control the second pull-up node PU2 to be electrically connected to the input end INPUT under the control of the input signal, and control the second pull-up node PU2 to be electrically connected to the first voltage end VD1 under the control of the resetting signal. The pull-down node control circuit 13 is connected to the pull-down node PD, the second pull-up node PU2, the second voltage end VD2 and a third voltage end VD3, and configured to control a potential at the pull-down node PD under the control of a voltage signal at the second pull-up node PU2. The output pull-up circuit 14 is connected to the first pull-up node PU1, a clock signal end CLK, and a gate driving signal output end OUTPUT, and configured to control the gate driving signal output end OUTPUT to be electrically connected to the clock signal end CLK under the control of a voltage signal at the first pull-up node PU1. The output pull-down circuit 15 is connected to the pull-down node PD, the third voltage end VD3 and the gate driving signal output end OUTPUT, and configured to control the gate driving signal output end OUTPUT to be electrically connected to the third voltage end VD3 under the control of the voltage signal at the pull-down node PD.

According to the embodiments of the present disclosure, the shift register unit is provided with two pull-up nodes, i.e., the first pull-up node PU1 and the second pull-up node PU2. The output of a gate driving signal may be controlled through the first pull-up node PU1, and the potential at the pull-down node PD may be controlled through the second pull-up node PU2, so it is able to prevent the occurrence of such a situation where it is difficult to set a width-to-length ratio of a transistor of the pull-down node control circuit 13 due to mutual restriction between one pull-up node and one pull-down node in the related art. In addition, the shift register unit is provided with the first voltage end VD1, and the first pull-up node control circuit 11 and the second pull-up node control circuit 12 are both connected to the first voltage end VD1, so it is able to reduce a leakage current of a transistor through increasing a voltage outputted by the first voltage end VD1 within a touch time period, thereby to prevent the occurrence of a false output when it is impossible to maintain a potential at the first pull-up node PU1 and a potential at the second pull-up node PU2 within the touch time period.

In the related art, the shift register unit is provided with merely one pull-up node, and the output of the gate driving signal and the potential at the pull-down node are controlled through the pull-up node simultaneously. In addition, the potential at the pull-up node is also adversely affected by the pull-down node, so it is difficult to set the width-to-length ratio of a transistor in a pull-down node control module. In the embodiments of the present disclosure, the shift register unit is provided with two pull-up nodes, the output of the gate driving signal is controlled through the first pull-up node PU1, and the potential at the pull-down node is controlled through the second pull-up node PU2, so it is able to solve the above-mentioned problem.

To be specific, the first pull-up node control circuit may include: a first pull-up node control transistor, a gate electrode of which is connected to the input end, a first electrode of which is connected to the second voltage end, and a second electrode of which is connected to the first pull-up node; a second pull-up node control transistor, a gate electrode of which is connected to the resetting end, a first electrode of which is connected to the first pull-up node, and a second electrode of which is connected to the first voltage end; and a third pull-up node control transistor, a gate electrode of which is connected to the pull-down node, a first electrode of which is connected to the first pull-up node, and a second electrode of which is connected to the first voltage end.

To be specific, the second pull-up node control circuit may include: a fifth pull-up node control transistor, a gate electrode of which is connected to the input end, a first electrode of which is connected to the second voltage end, and a second electrode of which is connected to the second pull-up node; and a sixth pull-up node control transistor, a gate electrode of which is connected to the resetting end, a first electrode of which is connected to the second pull-up node, and a second electrode of which is connected to the first voltage end.

Figure 2:
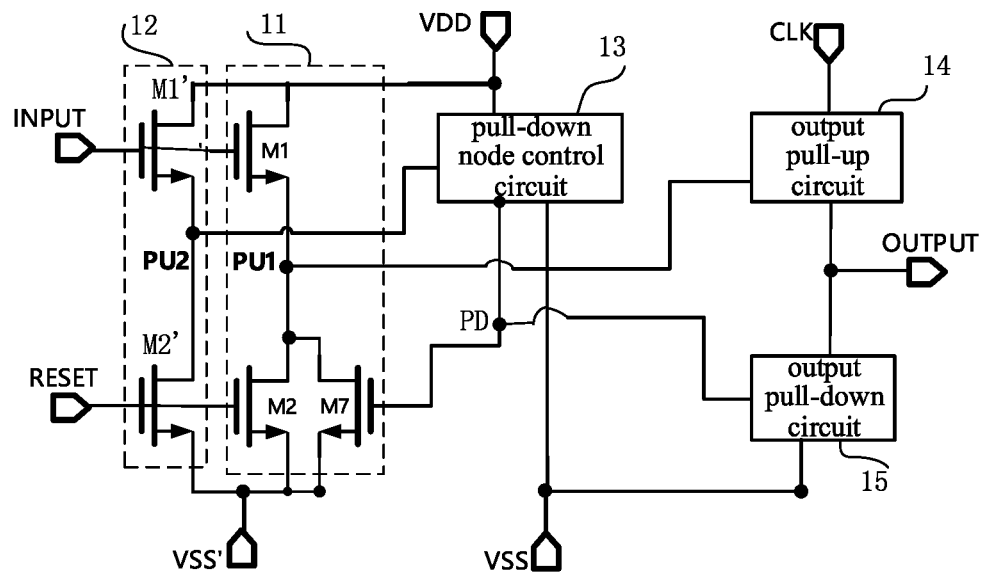
FIG. 2 is another schematic view showing the shift register unit according to one embodiment of the present disclosure.

In some embodiments of the present disclosure, on the basis of the shift register unit in FIG. 1, as shown in FIG. 2, the second voltage end is a high voltage end for inputting a high voltage VDD, and the first voltage end is a first low voltage end for inputting a first low voltage VSS'.

The first pull-up node control circuit 11 may include: a first pull-up node control transistor M1, a gate electrode of which is connected to the input end INPUT, a drain electrode of which is connected to the high voltage end for inputting the high voltage VDD, and a source electrode of which is connected to the first pull-up node PU1; a second pull-up node control transistor M2, a gate electrode of which is connected to the resetting end RESET, a drain electrode of which is connected to the first pull-up node PU1, and a source electrode of which is connected to the first low voltage end for inputting the first low voltage VSS'; and a third pull-up node control transistor M7, a gate electrode of which is connected to the pull-down node PD, a drain electrode of which is connected to the first pull-up node PU1, and a source electrode of which is configured to receive the first low voltage VSS'.

The second pull-up node control circuit 12 may include: a fifth pull-up node control transistor M1', a gate electrode of which is connected to the input end INPUT, a drain electrode of which is configured to receive the high voltage VDD, and a source electrode of which is connected to the second pull-up node PU2; and a sixth pull-up node control transistor M2', a gate electrode of which is connected to the resetting end RESET, a drain electrode of which is connected to the second pull-up node PU2, and a source electrode of which is configured to receive the first low voltage VSS'.

In FIG. 2, all the transistors are n-type transistors. However, in actual use, the transistors may also be p-type transistors.

During the operation of the shift register unit in FIG. 2, at an input stage of a display time period, under the control of the input signal applied to INPUT, M1 may be turned on so as to apply VDD to PU1, and M1' may also be turned on so as to apply VDD to PU2. At a resetting stage of the display period, under the control of the resetting signal applied to RESET, M2 may be turned on so as to apply VSS' to PU1, and M2' may be turned on so as to apply VSS' to PU2. With a touch time period, VSS' may be set as a reverse voltage, so as to control a leakage current of M2 and a leakage current of M7 to be smaller than a predetermined leakage current, and control a leakage current of M2' to be smaller than the predetermined leakage current.

For the shift register unit in FIG. 2, M2, M7 and M2' are all n-type transistors, so it is necessary to reduce a gate-to-source voltage of M2, M7 and M2' so as to reduce the leakage current of each of M2, M and M2'. Hence, within the touch time period, it is necessary to increase a potential of VSS'. For example, when VSS' is −8V within the display time period, it may be set as 0V within the touch time period, so as to reduce the gate-to-source voltage of each of the above transistors, and reduce the leakage current of each of the above transistors within the touch time period, thereby to maintain the potential at each of PU1 and PU2. In this way, it is able prevent the potential at each of PU1 and PU2 from being pulled down by PD within a next display time period due to a strong control capability of PD to each of PU1 and PU2 caused by the leakage current, thereby to prevent the gate driving circuit from being failed completely.

To be specific, the pull-down control circuit may include: a first pull-down node control transistor, a gate electrode and a first electrode of which are connected to the second voltage end, and a second electrode of which is connected to a pull-down control node; a second pull-down node control transistor, a gate electrode of which is connected to the second pull-up node, a first electrode of which is connected to the pull-down control node, and a second electrode of which is connected to the third voltage end; a third pull-down node control transistor, a gate electrode of which is connected to the pull-down control node, a first electrode of which is connected to the second voltage end, and a second electrode of which is connected to the pull-down node; and a fourth pull-down node control transistor, a gate electrode of which is connected to the second pull-up node, a first electrode of which is connected to the pull-down node, and a second electrode of which is connected to the third voltage end.

To be specific, the output pull-up circuit may include: an output pull-up transistor, a gate electrode of which is connected to the first pull-up node, a first electrode of which is connected to the clock signal end, and a second electrode of which is connected to the gate driving signal output end; and a storage capacitor, a first end of which is connected to the first pull-up node, and a second end of which is connected to the gate driving signal output end.

To be specific, the output pull-down circuit may include an output pull-down transistor, a gate electrode of which is connected to the pull-down node, a first electrode of which is connected to the gate driving signal output end, and a second electrode of which is connected to the third voltage end.

Figure 3:
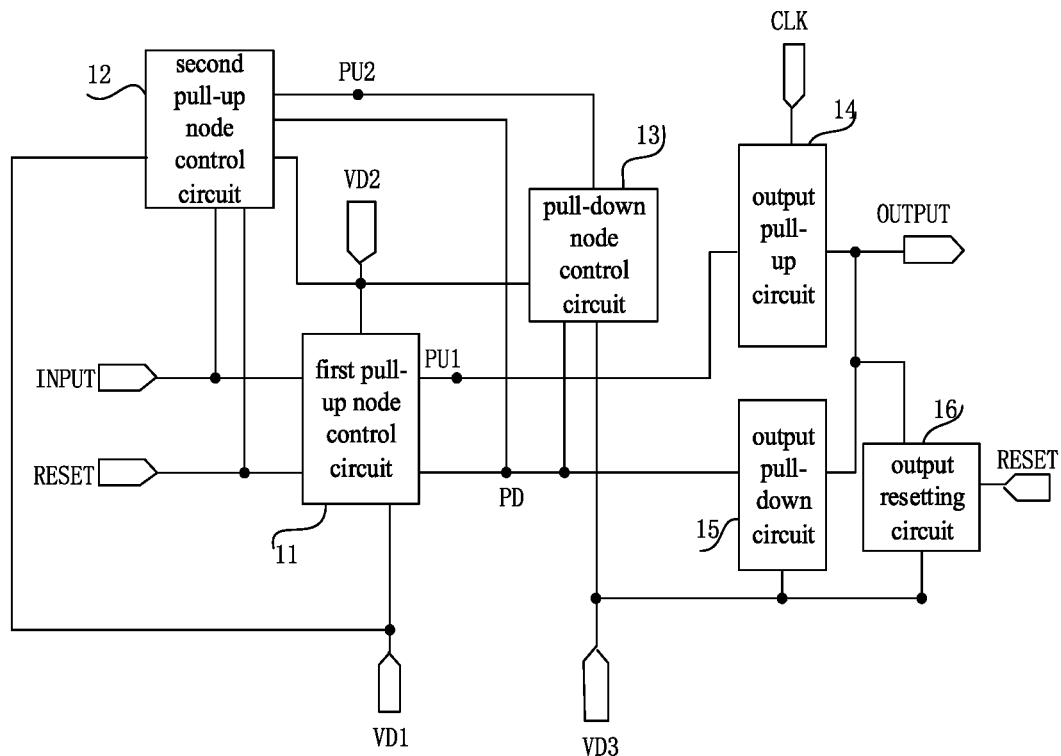
FIG. 3 is yet another schematic view showing the shift register unit according to one embodiment of the present disclosure.

In some embodiments of the present disclosure, on the basis of the shift register unit in FIG. 1, as shown in FIG. 3, the shift register unit may further include an output resetting circuit 16 connected to the resetting end RESET, the gate driving signal output end OUTPUT and the third voltage end VD3, and configured to, at the resetting stage, control the gate driving signal output end OUTPUT to be electrically connected to the third voltage end VD3 under the control of the resetting signal.

To be specific, the output resetting circuit may include an output resetting transistor, a gate electrode of which is connected to the resetting end, a first electrode of which is connected to the gate driving signal output end, and a second electrode of which is connected to the third voltage end.

The shift register unit will be described hereinafter in conjunction with a specific embodiment.

Figure 4:
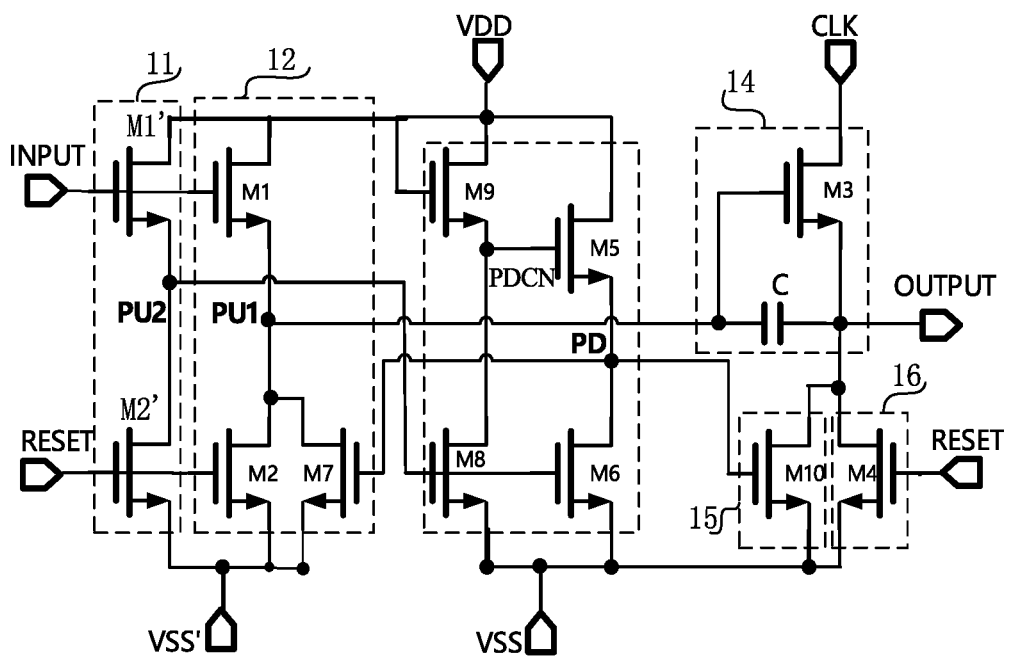
FIG. 4 is a circuit diagram of the shift register unit according to one embodiment of the present disclosure.

FIG. 4 shows a circuit diagram of the shift register unit. For the shift register unit in FIG. 4, the gate driving unit is an $N^{th}$-level shift register unit of a gate driving circuit. The $N^{th}$-level gate driving unit may enter the touch time period after an $N^{th}$ gate line has been scanned (i.e., after the $N^{th}$-level shift register unit of the gate driving circuit has been scanned). After the touch time period, an $(N+1)^{th}$-level shift register unit may be scanned continuously. The $(N+1)^{th}$-level shift register unit of the gate driving circuit may be connected to a first clock signal end CLK1, where N is a positive integer.

As shown in FIG. 4, the shift register unit may include the first pull-up node control circuit 11, the second pull-up node control circuit 12, the pull-down node control circuit 13, the output pull-up circuit 14, the output pull-down circuit 15 and the output resetting circuit 16.

The first pull-up node control circuit 11 may include: a first pull-up node control transistor M1, a gate electrode of which is connected to the input end INPUT, a drain electrode of which is connected to the high voltage end for inputting the high voltage VDD, and a source electrode of which is connected to the first pull-up node PU1; a second pull-up node control transistor M2, a gate electrode of which is connected to the resetting end RESET, a drain electrode of which is connected to the first pull-up node PU1, and a source electrode of which is configured to receive the first low voltage VSS'; and a third pull-up node control transistor M7, a gate electrode of which is connected to the pull-down node PD, a drain electrode of which is connected to the first pull-up node PU1, and a source electrode of which is configured to receive the first low voltage VSS'.

The second pull-up node control circuit 12 may include: a fifth pull-up node control transistor M1', a gate electrode of which is connected to the input end INPUT, a drain electrode of which is configured to receive the high voltage VDD, and a source electrode of which is connected to the second pull-up node PU2; and a sixth pull-up node control transistor M2', a gate electrode of which is connected to the resetting end RESET, a drain electrode of which is connected to the second pull-up node PU2, and a source electrode of which is configured to receive the first low voltage VSS'.

The pull-down node control circuit 13 may include: a first pull-down node control transistor M9, a gate electrode and a drain electrode of which are configured to receive the high voltage VDD, and a source electrode of which is connected to the pull-down control node PDCN; a second pull-down node control transistor M8, a gate electrode of which is connected to the second pull-up node PU2, a drain electrode of which is connected to the pull-down control node PDCN, and a source electrode of which is configured to receive the second low voltage VSS; a third pull-down node control transistor M5, a gate electrode of which is connected to the pull-down control node PDCN, a drain electrode of which is configured to receive the high voltage VDD, and a source electrode of which is connected to the pull-down node PD; and a fourth pull-down node control transistor M6, a gate electrode of which is connected to the second pull-up node PU2, a drain electrode of which is connected to the pull-down node PD, and a source electrode of which is configured to receive the second low voltage VSS.

The output pull-up circuit 14 may include: an output pull-up transistor M3, a gate electrode of which is connected to the first pull-up node PU1, a drain electrode of which is connected to the clock signal end CLK, and a source electrode of which is connected to the gate driving signal output end OUTPUT; and a storage capacitor C, a first end of which is connected to the pull-up node PU1, and a second end of which is connected to the gate driving signal output end OUTPUT.

The output pull-down circuit 15 may include an output pull-down transistor M10, a gate electrode of which is connected to the pull-down node PD, a drain electrode of which is connected to the gate driving signal output end OUTPUT, and a source electrode of which is configured to receive the second low voltage VSS.

The output resetting circuit 16 may include an output resetting transistor M4, a gate electrode of which is connected to the resetting end RESET, a drain electrode of which is connected to the gate driving signal output end OUTPUT, and a source electrode of which is configured to receive the second low voltage VSS.

In FIG. 4, the transistors may be, but not limited to, n-type transistors.

According to the shift register units in FIG. 4, two pull-up nodes, i.e., the first pull-up node PU1 and the second pull-up node PU2, may be adopted. PU1 is configured to control the gate electrode of M3, and PU2 is configured to control the gate electrode of each of M6 and M8, so as to discharge PD and PDCN. The potential at PD may be controlled through PU2, but PU2 may be discharged through M2' rather than PD. The shift register unit has the following advantages. The two pull-up nodes may operate separately as long as a width-to-length ratio of each of M5 and M6 is set as small as possible, so it is able to prevent the failure of OUTPUT from occurring frequently and prevent the occurrence of an insufficient output capability of the gate driving signal due to an inappropriate design ratio and a manufacture process of the transistors, thereby to improve the reliability of a Gate On Array (GOA) circuit. In addition, within the touch time period for a touch and scanning operation, VSS may be always −8V, so as to pull up VSS' from a low level to 0V, thereby to enable the gate-to-source voltage of each of M2, M7 and M2' to be −8V within the touch time period. At this time, the leakage current of each of M2, M7 and M2' may be negligibly small, so it is able to prevent the potential at each of PU1 and PU2 from being reduced due to a significant leakage current within the touch time period.

Figure 5:
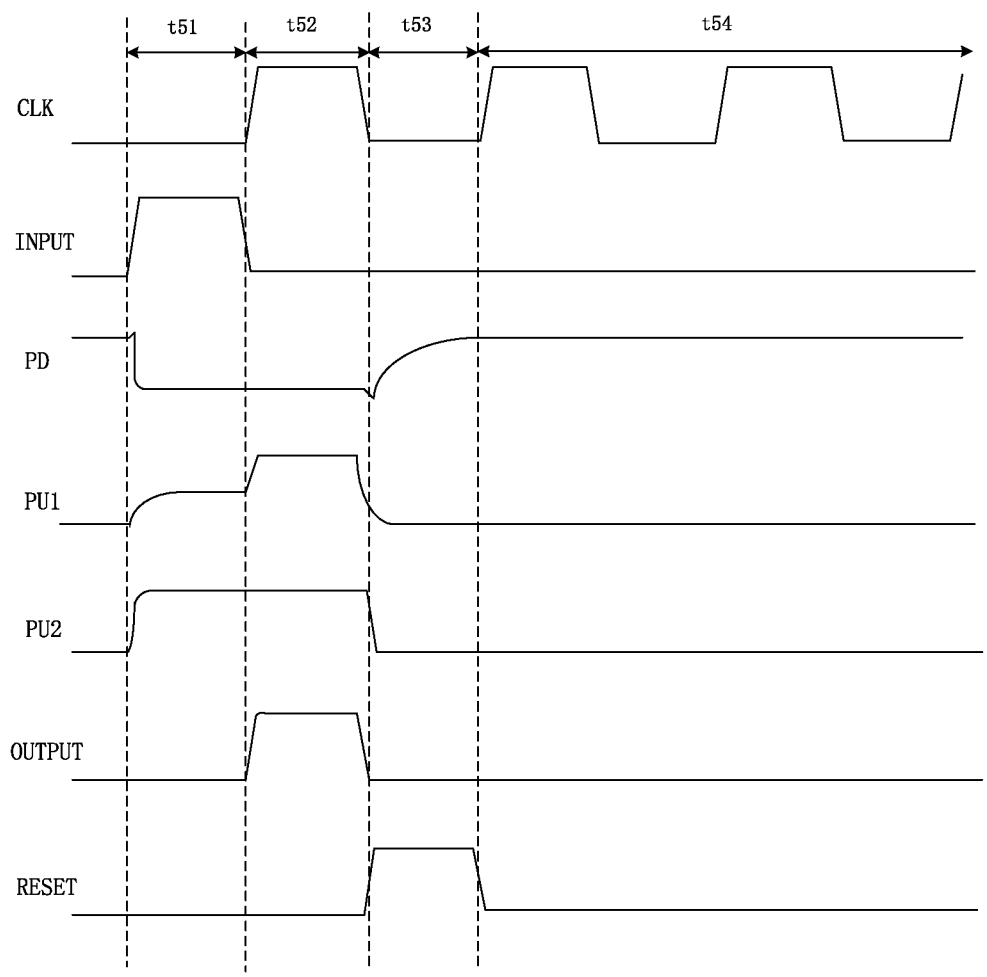
FIG. 5 is a time sequence diagram of the shift register unit according to one embodiment of the present disclosure.

During the operation of the shift register unit in FIG. 4, within the display time period, VSS and VSS' may each be −8V, and within the touch time period, VSS' may be 0V and VSS may be −8V As shown in FIG. 5, during the operation of the shift register unit in FIG. 4, at an input stage t51 of the display time period, INPUT may input a high level, RESET may output a low level, and CLK may output a low level, so as to turn on M1 and M1' to apply VDD to PU1 and PU2, turn on M6 and M8 to control PD to be at a low level, and turn on M3 to enable OUTPUT to be electrically connected to CLK. At this time, OUTPUT may output a low level. At an output stage t52, INPUT may input a low level, RESET may output a low level, and CLK may output a high level, so as to bootstrap the potential at PU1 by the storage capacitor C, and turn on M3, thereby to enable OUTPUT to be electrically connected to CLK. At this time, OUTPUT may output a high level. At a resetting stage t53, INPUT may input a low level, RESET may output a high level, and CLK may output a low level, so as to turn on M2 and M2', thereby to pull down the potential at each of PU1 and PU2 to −8V, pull up the potential at PDCN to VDD through M9, and pull up the potential at PD to VDD through M5. In addition, M4 and M10 may be turned on, so as to pull down the potential of the gate driving signal from OUTPUT to −8V. At an output cutoff maintenance stage t54, INPUT may input a low level, RESET may output a low level, and CLK may output a high level and a low level alternately, so as to enable the potential at PD to be a high level and turn on M10, thereby to continuously pull down the potential of the gate driving signal from OUTPUT to −8V.

In the related art, the shift register unit merely includes one pull-up node PU and the second low voltage end for inputting the second low voltage VSS, i.e., it does not include M1', M2, and the first low voltage end for inputting the first low voltage VSS' in FIG. 4. During a normal display scanning operation of the conventional gate driving circuit, when a high level is applied to an input end of an $N^{th}$-level shift register (N is a positive integer), a potential at a pull-up node of the $N^{th}$-level shift register may be pulled up, and the pull-up node may be connected to the drain electrode of each of M1, M2 and M7. For a conventional Liquid Crystal Display (LCD) with a relatively large quantity of amorphous silicon (a-Si) thin film transistors (TFTs), when a gate-to-source voltage of each transistor is approximately −8V, there is a minimum leakage current of the transistor. In addition, for a conventional Organic Light-Emitting Diode (OLED) display device with a relatively large quantity of Low Temperature Poly-silicon (LTPS) TFTs, when a gate-to-source voltage of each transistor is approximately −8V, there is a minimum leakage current of the transistor, and when the gate-to-source voltage is 0V, there is relatively large leakage current of the transistor. For an in-cell touch display device, a duration of the touch time period may be at a millisecond level, and a decrease in a voltage across the pull-up node due to the leakage current of the transistor within the touch time period cannot be omitted. In the conventional shift register unit, a direct current high voltage is directly applied to the drain electrode of each of M5 and M9, so theoretically the potential at the pull-down control node PDCN and the potential at the pull-down node PD may be pulled up to a high level all the time. However, in actual use, after the pull-up node is charged through the input signal from the input end, the potential at the pull-down node PD may be pulled by the pull-up node down to a low level through M6, so the voltage across PU needs to be larger so as to meet the mutual restriction between the pull-up node PU and the pull-down node PD. When designing a proportion of the width-to-length ratio of M5 to the width-to-length ratio of M6, usually the proportion is designed as 1:A, where A is an integer greater than or equal to 2 and smaller than or equal to 5. When the proportion is too small, the control capability of PU to PD may be insufficient. When the potential at PU needs to be a high level, PU may probably be discharged through PD, and at this time, the potential at PU may be low, and M3 may be turned on in an insufficient manner, so the output capability of the gate driving signal output end may be adversely affected. When the proportion is too large, the control capability of PU to PD may be too strong. After the operation of a current-level shift register unit, the potential at PU should have been at a low level, but due to the insufficient noise reduction capability of the PD, the potential at PU may be a high level continuously, resulting a display abnormality. Before the design of the gate driving circuit, an appropriate proportion of the width-to-length ratio of M5 to the width-to-length ratio of M6 may be simulated. However, it is difficult to estimate and control the accuracy of the manufacture process, so an inappropriate proportion may usually occur for the gate driving circuit. Especially, when the gate driving circuit is applied to an in-cell touch display product and the mutual restriction between PU and PD of a current-level shift register unit is satisfied, because the potential at PU within the touch time period decreases due to the leakage current, the gate driving circuit may fail due to a too strong control capability of PD to PU of the following several shift register units after the touch time period.

The present disclosure further provides in some embodiments a method of driving the above-mentioned shift register unit, including: at an input stage of a display time period, controlling, by a first pull-up node control circuit, a first pull-up node to be electrically connected to a second voltage end under the control of an input signal applied to an input end, controlling, by a second pull-up node control circuit, a second pull-up node to be electrically connected to the second voltage end under the control of the input signal applied to the input end, controlling, by a pull-down node control circuit, a potential at a pull-down node to be a first level under the control of a voltage signal at the second pull-up node, and controlling, by an output pull-up circuit, a gate driving signal output end to be electrically connected to a clock signal end under the control of a voltage signal at the first pull-up node; at an output stage of the display time period, bootstrapping, by the output pull-up circuit, a potential at the first pull-up node, and controlling, by the output pull-up circuit, the gate driving signal output end to be electrically connected to the clock signal end under the control of the voltage signal at the first pull-up node; at a resetting stage of the display time period, controlling, by the first pull-up node control circuit, the first pull-up node to be electrically connected to a first voltage end under the control of a resetting signal from a resetting end, and controlling, by the second pull-up node control circuit, the second pull-up node to be electrically connected to the first voltage end under the control of the resetting signal; and at the resetting stage and an output cutoff maintenance stage of the display time period, controlling, by the pull-down node control circuit, the pull-down node to be electrically connected to the second voltage end under the control of the voltage signal at the second pull-up node, and controlling, by an output pull-down circuit, the gate driving signal output end to be electrically connected to a third voltage end under the control of a voltage signal at the pull-down node.

According to the method in the embodiments of the present disclosure, the output of the gate driving signal is controlled through the first pull-up node, and the potential at the pull-down node is controlled through the second pull-up node, so it is able to prevent the occurrence of such a situation where it is difficult to set a width-to-length ratio of a transistor of the pull-down node control circuit due to mutual restriction between one pull-up node and one pull-down node in the related art.

To be specific, the method may further include, within a touch time period, applying a reverse voltage to the first voltage end, so as to control a leakage current of a transistor of the first pull-up node control circuit whose first electrode is connected to the first pull-up node is smaller than a predetermined leakage current, and control a leakage current of a transistor of the second pull-up node control circuit whose first electrode is connected to the second pull-up node is smaller than the predetermined leakage current.

In the embodiments of the present disclosure, through increasing the voltage outputted by the first voltage end within the touch time period, it is able to reduce the leakage current of the transistor of the first pull-up node control circuit whose first electrode is connected to the first pull-up node and the leakage current of the transistor of the second pull-up node control circuit whose first electrode is connected to the second pull-up node, thereby to prevent the occurrence of a false output when it is impossible to maintain a potential at the first pull-up node and a potential at the second pull-up node within the touch time period.

During the implementation, the shift register unit may further include an output resetting circuit, and the method may further include, at the resetting stage, controlling, by the output resetting circuit, the gate driving signal output end to be electrically connected to the third voltage end under the control of the resetting signal.

The present disclosure further provides in some embodiments a gate driving circuit including multiple levels of the above-mentioned shift register units. Apart from a first-level shift register unit, an input end of a current-level shift register unit is connected to a gate driving signal output end of a previous-level shift register unit, and apart from a last-level shift register unit, a resetting end of the current-level shift register unit is connected to a gate driving signal output end of a next-level shift register unit.

Figure 6:
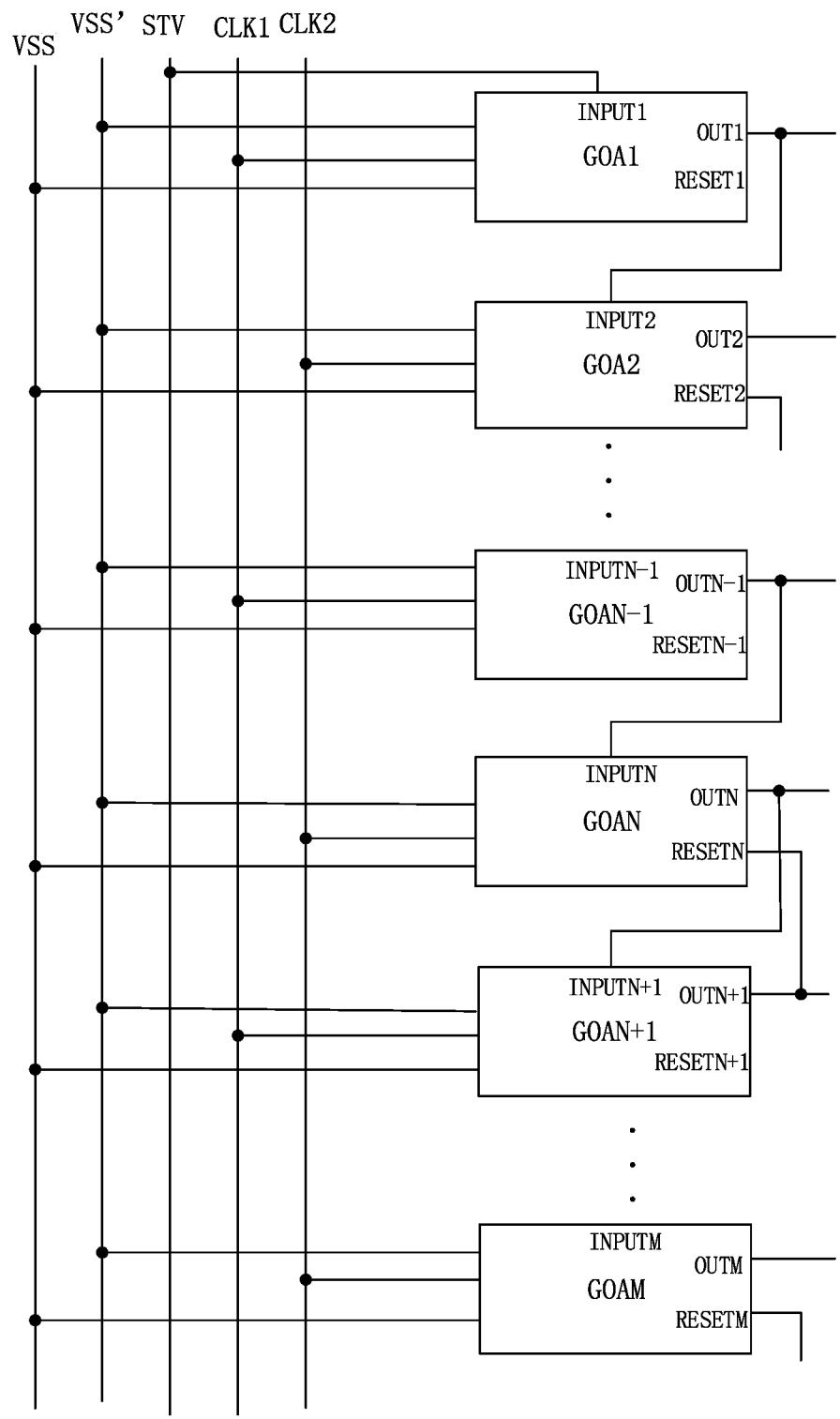
FIG. 6 is a schematic view showing a gate driving circuit according to one embodiment of the present disclosure.

As shown in FIG. 6, the gate driving circuit may include M levels of shift register units, where M is a positive integer.

In FIG. 6, GOA1 represents a first-level shift register unit of the gate driving circuit. GOA1 is configured to receive VSS and VSS', and connected to a first clock signal end CLK1. OUT1 represents a gate driving signal output end of GOA1, and an input end INPUT1 of GOA1 is configured to receive a start signal STV.

GOA2 represents a second-level shift register unit of the gate driving circuit. GOA2 is configured to receive VSS and VSS', and connected to a second clock signal end CLK2. OUT2 represents a gate driving signal output end of GOA2, and an input end INPUT2 of GOA2 is connected to OUT1. RESET2 represents a resetting end of GOA2, and OUT2 is connected to a resetting end RESET1 of GOA1.

GOAN−1 represents an $(N-1)^{th}$-level shift register unit of the gate driving circuit. GOAN−1 is configured to receive VSS and VSS', and connected to the first clock signal end CLK1. OUTN−1 represents a gate driving signal output end of GOAN−1, INPUTN−1 represents an input end of GOAN−1, and RESETN−1 represents a resetting end of GOAN−1.

GOAN represents an $N^{th}$-level shift register unit of the gate driving circuit. GOAN is configured to receive VSS and VSS', and connected to the second clock signal end CLK2. OUTN represents a gate driving signal output end of GOAN, INPUTN represents an input end of GOAN, and RESETN represents a resetting end of GOAN. INPUTN is connected to OUTN−1, and RESETN−1 is connected to OUTN.

GOAN+1 represents an $(N+1)^{th}$-level shift register unit of the gate driving circuit. GOAN+1 is configured to receive VSS and VSS', and connected to the first clock signal end CLK1. OUTN+1 represents a gate driving signal output end of GOAN+1, INPUTN+1 represents an input end of GOAN+1, and RESETN+1 represents a resetting end of GOAN+1. INPUTN+1 is connected to OUTN, and RESETN is connected to OUTN+1.

GOAM represents an $M^{th}$-level shift register unit of the gate driving circuit. GOAM is configured to receive VSS and VSS', and connected to the second clock signal end CLK2. OUTM represents a gate driving signal output end of GOAM, INPUTM represents an input end of GOAM, and RESETM represents a resetting end of GOAM. N is a positive integer greater than 1, and N+1 is smaller than M.

For the gate driving circuit in FIG. 6, a first clock signal outputted by CLK1 may be of a phase reverse to a second clock signal outputted by CLK2. The gate driving circuit may enter the touch time period LHB after an Nth gate line has been scanned (i.e., after GOAN has completed a gate driving scanning operation). After the touch time period LHB, the $(N+1)^{th}$-level shift register unit GOAN+1 may be scanned continuously.

Figure 7:
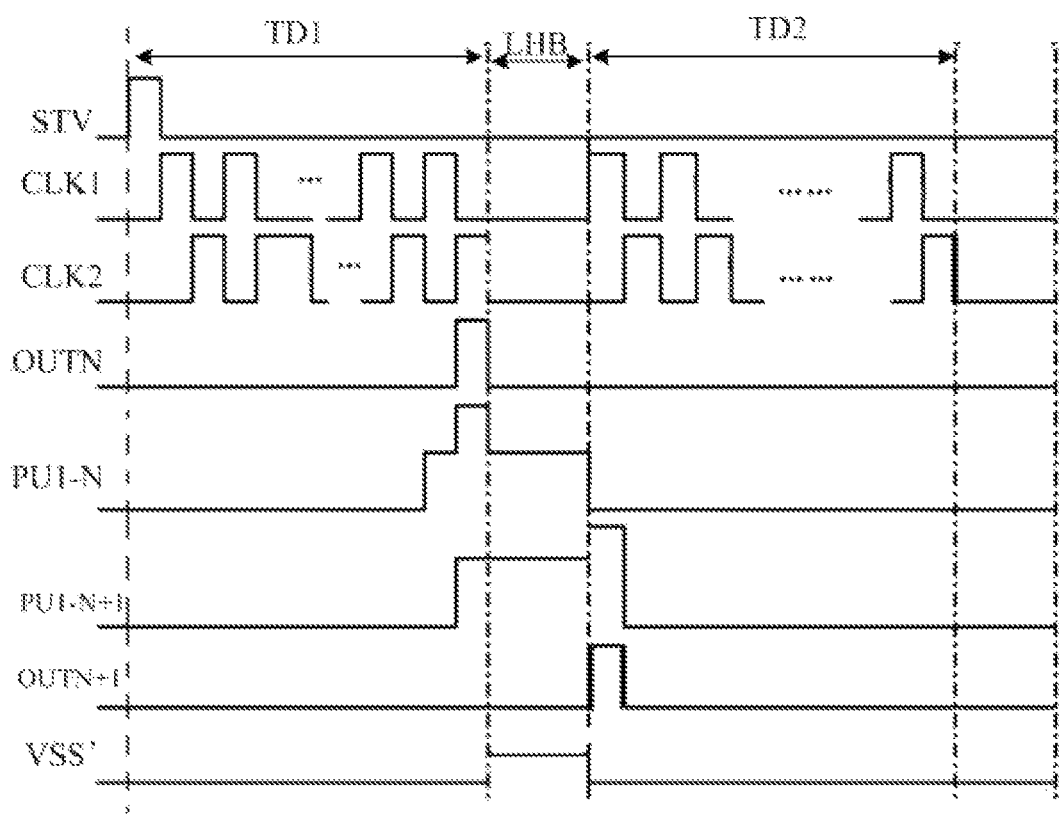
FIG. 7 is a time sequence diagram of the gate driving circuit according to one embodiment of the present disclosure.

When each level of shift register unit included in the gate driving circuit in FIG. 6 has a structure in FIG. 4, a time sequence diagram of the gate driving circuit in FIG. 6 may be shown in FIG. 7.

In FIG. 7, PU1-N represents a first pull-up node of GOAN, PU-N+1 represents a first pull-up node of GOAN+1, and VSS' represents the first low voltage.

As shown in FIG. 7, within a first display time period TD1, GOA1 to GOAN may be scanned, and within a second display time period TD2, GOAN+1 to GOAM may be scanned. Within the touch time period LHB, a touch scanning operation may be performed. Within the touch time period LBH, VSS' may be pulled up to 0V, and within the first display time period TD1 and the second display time period TD2, VSS' may be −8V.

In addition, within the first display time period TD1, the touch time period LHB and the second display time period TD2, VSS may be maintained as −8V all the time.

As shown in FIG. 7, during the operation of the gate driving circuit, within the touch time period LHB, a potential at PU1-N and a potential at PU1-N+1 may be maintained as a high level, so that GOAN+1 may operate normally and OUTN+1 may output the gate driving signal normally after LHB.

The present disclosure further provides in some embodiments a display device including the above-mentioned gate driving circuit.

The display device may be any product or member having a display function, e.g., mobile phone, flat-panel computer, television, display, laptop computer, digital photo frame or navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A shift register unit, comprising a first pull-up node control circuit, a second pull-up node control circuit, a pull-down node control circuit, an output pull-up circuit and an output pull-down circuit, wherein:
   the first pull-up control circuit is electrically connected to a first pull-up node, a first voltage end, an input end, a resetting end and a second voltage end, and configured to control the first pull-up node to be electrically connected to the second voltage end under the control of an input signal applied to the input end, and control the first pull-up node to be electrically connected to the first voltage end under the control of a resetting signal from the resetting end;
   the second pull-up node control circuit is electrically connected to a second pull-up node, the first voltage end, the input end, the resetting end and the second voltage end, and configured to control the second pull-up node to be electrically connected to the second voltage end under the control of the input signal applied to the input end, and control the second pull-up node to be electrically connected to the first voltage end under the control of the resetting signal from the resetting end;
   the pull-down node control circuit is electrically connected to the pull-down node, the second pull-up node and a third voltage end, and configured to control a potential at the pull-down node under the control of a voltage signal at the second pull-up node;
   the output pull-up circuit is electrically connected to the first pull-up node, a clock signal end, and a gate driving signal output end, and configured to control the gate driving signal output end to be electrically connected to the clock signal end under the control of a voltage signal at the first pull-up node; and
   the output pull-down circuit is electrically connected to the pull-down node and the gate driving signal output end, and configured to control a potential of the gate driving signal output end under the control of the voltage signal at the pull-down node.

2. The shift register unit according to claim 1, wherein the first pull-up node control circuit comprises:
   a first transistor, a gate electrode of which is connected to the input end, a first electrode of which is connected to the second voltage end, and a second electrode of which is connected to the first pull-up node;
   a second transistor, a gate electrode of which is connected to the resetting end, a first electrode of which is connected to the first pull-up node, and a second electrode of which is connected to the first voltage end.

3. The shift register unit according to claim 1, wherein the second pull-up node control circuit comprises:

an eleventh transistor, a gate electrode of which is connected to the input end, a first electrode of which is connected to the second voltage end, and a second electrode of which is connected to the second pull-up node; and a twelfth transistor, a gate electrode of which is connected to the resetting end, a first electrode of which is connected to the second pull-up node, and a second electrode of which is connected to the first voltage end.

4. The shift register unit according to claim 1, wherein the pull-down control circuit comprises:
   a ninth transistor, a gate electrode of which is connected to a first electrode of the ninth transistor, and a second electrode of which is connected to a pull-down control node;
   an eighth transistor, a first electrode of which is connected to the pull-down control node;
   a fifth transistor, a gate electrode of which is connected to the pull-down control node, and a second electrode of which is connected to the pull-down node; and
   a sixth transistor, a gate electrode of which is connected to the second pull-up node, a first electrode of which is connected to the pull-down node, and a second electrode of which is connected to the third voltage end.

5. The shift register unit according to claim 1, wherein the output pull-up circuit comprises:
   a third transistor, a gate electrode of which is connected to the first pull-up node, a first electrode of which is connected to the clock signal end, and a second electrode of which is connected to the gate driving signal output end; and
   a storage capacitor, a first end of which is connected to the first pull-up node, and a second end of which is connected to the gate driving signal output end.

6. The shift register unit according to claim 1, wherein the output pull-down circuit comprises a tenth transistor, a gate electrode of which is connected to the pull-down node, a first electrode of which is connected to the gate driving signal output end.

7. The shift register unit according to claim 1, further comprising an output resetting circuit connected to the gate driving signal output end, and configured to reset the gate driving signal output end.

8. The shift register unit according to claim 7, wherein the output resetting circuit comprises a fourth transistor, a first electrode of which is connected to the gate driving signal output end, and a second electrode of which is connected to a reset voltage end.

9. The shift register unit according to claim 2, wherein the first pull-up node control circuit is further connected to the pull-down node, and configured to control a potential of the first pull-up node under control of the pull-down node.

10. The shift register unit according to claim 9, wherein the first pull-up node control circuit further comprises a seventh transistor, a gate electrode of which is connected to the pull-down node, a first electrode of which is connected to the first pull-up node.

11. A shift register unit, comprising a first pull-up node control circuit, a second pull-up node control circuit, a pull-down node control circuit, an output pull-up circuit and an output pull-down circuit, wherein
   the first pull-up control circuit is electrically connected to a first pull-up node, a first voltage end, an input end, a resetting end, and a second voltage end,
   wherein the first pull-up node control circuit comprises a first transistor, a gate electrode of which is connected to the input end, a first electrode of which is connected to the second voltage end, and a second electrode of which is connected to the first pull-up node; a second transistor, a gate electrode of which is connected to the resetting end, a first electrode of which is connected to the first pull-up node, and a second electrode of which is connected to the first voltage end;
   the second pull-up node control circuit is electrically connected to a second pull-up node, the first voltage end, the input end, the resetting end and the second voltage end, wherein the second pull-up node control circuit comprises an eleventh transistor, a gate electrode of which is connected to the input end, a first electrode of which is connected to the second voltage end, and a second electrode of which is connected to the second pull-up node; and a twelfth transistor, a gate electrode of which is connected to the resetting end, a first electrode of which is connected to the second pull-up node, and a second electrode of which is connected to the first voltage end;
   the pull-down node control circuit is electrically connected to the pull-down node, the second pull-up node and a third voltage end;
   the output pull-up circuit is electrically connected to the first pull-up node, a clock signal end, and a gate driving signal output end; and
   the output pull-down circuit is directly connected to the pull-down node and the gate driving signal output end.

12. The shift register unit according to claim 11, wherein the first pull-up node control circuit is further connected to the pull-down node, the first pull-up node control circuit further comprises:
   a seventh transistor, a gate electrode of which is directly connected to the pull-down node, a first electrode of which is directly connected to the first pull-up node.

13. The shift register unit according to claim 11, wherein the pull-down node control circuit comprises:
   a ninth transistor, a gate electrode of which is connected to a first electrode of the ninth transistor, and a second electrode of which is directly connected to the pull-down control node;
   an eighth transistor, a first electrode of which is directly connected to the pull-down control node;
   a fifth transistor, a gate electrode of which is directly connected to the pull-down control node, and a second electrode of which is directly connected to the pull-down node; and
   a sixth transistor, a gate electrode of which is directly connected to the second pull-up node, a first electrode of which is directly connected to the pull-down node, and a second electrode of which is directly connected to the third voltage end.

14. The shift register unit according to claim 11, wherein the output pull-up circuit comprises:
   a third transistor, a gate electrode of which is directly connected to the first pull-up node, a first electrode of which is directly connected to the clock signal end, and a second electrode of which is directly connected to the gate driving signal output end; and
   a storage capacitor, a first end of which is directly connected to the first pull-up node, and a second end of which is directly connected to the gate driving signal output end.

15. The shift register unit according to claim 11, wherein the output pull-down circuit comprises a tenth transistor, a gate electrode of which is directly connected to the pull-down node, a first electrode of which is directly connected to the gate driving signal output end.

16. The shift register unit according to claim 11, further comprising an output resetting circuit electrically connected to the gate driving signal output end, the output resetting circuit comprises a fourth transistor, a first electrode of which is connected to the gate driving signal output end, and a second electrode of which is connected to a reset voltage end.

17. A shift register unit, comprising:
- a first transistor comprising a gate electrode electrically connected to an input end, a first electrode electrically connected to a second voltage end, a second electrode electrically connected to a first control node;
- a second transistor comprising a gate electrode electrically connected to a resetting end, a first electrode electrically connected to the first control node, a second electrode electrically connected to a first voltage end;
- an eleventh transistor comprising a gate electrode electrically connected to the input end, a first electrode electrically connected to the second voltage end, a second electrode electrically connected to a second control node;
- a twelfth transistor comprising a gate electrode electrically connected to the resetting end, a first electrode electrically connected to the second control node, a second electrode electrically connected to the first voltage end;
- a seventh transistor comprising a gate electrode electrically connected to a third control node, a first electrode electrically connected to the first control node;
- a ninth transistor comprising a gate electrode electrically connected to a first electrode of the ninth transistor, a second electrode electrically connected to a fourth control node;
- an eighth transistor comprising a first electrode electrically connected the fourth control node;
- a fifth transistor comprising a gate electrode electrically connected to the fourth control node, a second electrode electrically connected to the third control node;
- a sixth transistor comprising a gate electrode electrically connected to the second control node, a first electrode electrically connected the third control node, a second electrode electrically connected to the third voltage end;
- a third transistor comprising a gate electrode electrically connected to the first control node, a first electrode electrically connected to a clock signal end, a second electrode electrically connected to a gate driving signal output end;
- a storage capacitor comprising a first end electrically connected to the first control node, a second end electrically connected to the gate driving signal output end;
- a tenth transistor comprising a gate electrode electrically connected to the third control node, a first electrode electrically connected to the gate driving signal output end.

\* \* \* \* \*